(12) United States Patent
Yamanaka et al.

(10) Patent No.: US 10,074,578 B2
(45) Date of Patent: Sep. 11, 2018

(54) SEMICONDUCTOR DEVICE AND METHOD FOR PRODUCING THE SAME

(71) Applicant: Mitsubishi Electric Corporation, Tokyo (JP)

(72) Inventors: Nobuaki Yamanaka, Tokyo (JP); Daisuke Chikamori, Tokyo (JP); Toru Jokaku, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/427,861

(22) Filed: Feb. 8, 2017

(65) Prior Publication Data

US 2017/0352600 A1    Dec. 7, 2017

(30) Foreign Application Priority Data

Jun. 3, 2016  (JP) ................................ 2016-111448

(51) Int. Cl.

| | |
|---|---|
| *H01L 21/66* | (2006.01) |
| *H01L 29/16* | (2006.01) |
| *H01L 29/36* | (2006.01) |
| *H01L 21/306* | (2006.01) |
| *H01L 21/02* | (2006.01) |
| *H01L 21/04* | (2006.01) |

(52) U.S. Cl.
CPC ........ *H01L 22/14* (2013.01); *H01L 21/02529* (2013.01); *H01L 21/046* (2013.01); *H01L 21/30604* (2013.01); *H01L 22/30* (2013.01); *H01L 29/1608* (2013.01); *H01L 29/36* (2013.01)

(58) Field of Classification Search
CPC . H01L 22/14; H01L 21/046; H01L 21/02529; H01L 21/30604; H01L 29/36; H01L 29/1608; H01L 22/30; G01R 17/105; G01R 27/08

See application file for complete search history.

(56) References Cited

U.S. PATENT DOCUMENTS

| | | | | |
|---|---|---|---|---|
| 5,066,938 A | * | 11/1991 | Kobashi ................. | G01K 7/223 338/22 SD |
| 6,673,640 B2 | * | 1/2004 | Naruoka ................. | H01L 22/34 250/458.1 |

(Continued)

FOREIGN PATENT DOCUMENTS

| | | | | |
|---|---|---|---|---|
| DE | 19849471 A1 | * | 4/2000 | ............ H01L 28/20 |
| JP | 2013-026563 A | | 2/2013 | |

(Continued)

*Primary Examiner* — Earl Taylor
(74) *Attorney, Agent, or Firm* — Studebaker & Brackett PC

(57) ABSTRACT

Provided is a semiconductor device capable of measuring a depth of removal of a silicon carbide (SiC) wafer with high accuracy through simple steps, and a method for producing the semiconductor device. The semiconductor device according to an aspect of the present invention includes at least one evaluation element disposed on a SiC wafer. The evaluation element includes a doped region doped with a dopant on the SiC wafer, and an insulating film partially covering the doped region. The insulating film includes a plurality of partial insulating films. The doped region includes a plurality of regions sectioned by the plurality of partial insulating films in a plan view.

13 Claims, 7 Drawing Sheets

(56) References Cited

U.S. PATENT DOCUMENTS

| | | | | |
|---|---|---|---|---|
| 8,012,837 | B2* | 9/2011 | Nishio | H01L 29/0878 257/E21.09 |
| 8,198,182 | B2* | 6/2012 | Shibagaki | H01L 21/046 438/514 |
| 8,587,072 | B2* | 11/2013 | Oritsuki | H01L 29/456 257/358 |
| 9,153,505 | B2* | 10/2015 | Kobayashi | H01L 21/26513 |
| 9,201,094 | B2* | 12/2015 | Fujiwara | G01R 1/06755 |
| 9,502,552 | B2* | 11/2016 | Uchida | H01L 21/046 |
| 2005/0239230 | A1* | 10/2005 | Yang | B82Y 15/00 438/48 |
| 2011/0121317 | A1* | 5/2011 | Shibagaki | H01L 21/046 257/77 |
| 2011/0284871 | A1* | 11/2011 | Harada | H01L 21/02529 257/77 |
| 2014/0159705 | A1* | 6/2014 | Fujiwara | G01R 1/06755 324/149 |
| 2015/0021742 | A1* | 1/2015 | Van Brunt | H01L 22/12 257/618 |
| 2015/0041828 | A1* | 2/2015 | Nagao | H01L 29/872 257/77 |
| 2015/0072448 | A1* | 3/2015 | Kobayashi | H01L 21/26513 438/17 |
| 2015/0303266 | A1* | 10/2015 | Hiyoshi | H01L 21/3065 257/77 |
| 2017/0033011 | A1* | 2/2017 | Rupp | H01L 29/2003 |
| 2017/0179223 | A1* | 6/2017 | Nagao | H01L 29/0623 |
| 2017/0352600 | A1* | 12/2017 | Yamanaka | H01L 22/14 |

FOREIGN PATENT DOCUMENTS

| | | | | |
|---|---|---|---|---|
| JP | 2014-116449 A | | 6/2014 | |
| WO | WO 2009088081 A1 | * | 7/2009 | H01L 22/14 |
| WO | WO 2013137177 A1 | * | 9/2013 | H01L 29/872 |
| WO | WO 2015033476 A1 | * | 3/2015 | H01L 27/101 |

* cited by examiner

SEMICONDUCTOR DEVICE AND METHOD FOR PRODUCING THE SAME

BACKGROUND OF THE INVENTION

Field of the Invention

The present invention relates to semiconductor devices and methods for producing the same, more specifically to a semiconductor device that includes a silicon carbide (SiC) wafer as a substrate and to a method for producing the same.

Description of the Background Art

An example of process steps of making a metal-oxide-semiconductor field-effect transistor (MOS-FET) on the SiC wafer is described in Japanese Patent Application Laid-Open No. 2013-26563; that is, implanting an impurity into the SiC wafer before forming an interlayer insulating film on a surface of the SiC wafer, then dry-etching the interlayer insulating film for partial removal, and then making a pattern to form a field oxide film. At this point, the etching of the interlayer insulating film is accompanied by the removal of the surface of the SiC wafer. Here, a non-limiting example of the interlayer insulating film is a tetra-ethyl-ortho-silicate (TEOS) film formed by chemical vapor deposition (CVD).

A change in depth of removal of the SiC wafer changes the thickness of an implanted layer. This causes a variation in property of a threshold voltage Vth of the MOS-FET.

An example of a conventional technique for regulating the depth of removal of the SiC wafer is measuring a depth of removal of a substrate using a step measuring instrument. Further, Japanese Patent Application Laid-Open No. 2014-116449 describes an example of a known method for bringing a probe into direct contact with the SiC wafer to measure an electrical property of the SiC wafer.

In an effort to measure the depth of removal of the SiC wafer using the step measuring instrument, sufficient accuracy in measurement for regulating the property of the threshold voltage Vth is difficult to be achieved, because the smaller the depth of removal is, the poorer the accuracy in measurement is since the surface of the wafer is directly scanned by the probe to measure a step (i.e., depth of removal). Further, a depth measured by the step measuring instrument amounts to the sum of the thickness of the interlayer insulating film and the depth of removal of the SiC wafer. Thus, a measured value is unfortunately affected by variations in thickness of the interlayer insulating film.

In an effort to measure the thickness of the interlayer insulating film alone using the step measuring instrument, additional process steps are required in order to etch an oxide film around a pattern that is a target of step measurement.

SUMMARY OF THE INVENTION

It is an object of the present invention to provide a semiconductor device capable of measuring a depth of removal of a SIC wafer with high accuracy through simple steps, and a method for producing the semiconductor device.

The semiconductor device according to an aspect of the present invention includes at least one evaluation element disposed on a SIC wafer. The at least one evaluation element eludes a doped region doped with a dopant on the SiC wafer, and an insulating film partially covering the doped region. The insulating film includes a plurality of partial insulating films. The doped region includes a plurality of regions sectioned by the plurality of partial insulating films in a plan view.

The semiconductor device according to the aspect of the present invention includes the evaluation element disposed on the SiC wafer. Such a configuration enables a resistance of the evaluation element to be measured, and enables the depth of removal of the SiC wafer to be estimated, using the resistance as measured.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

<Configuration>

Figure 1:
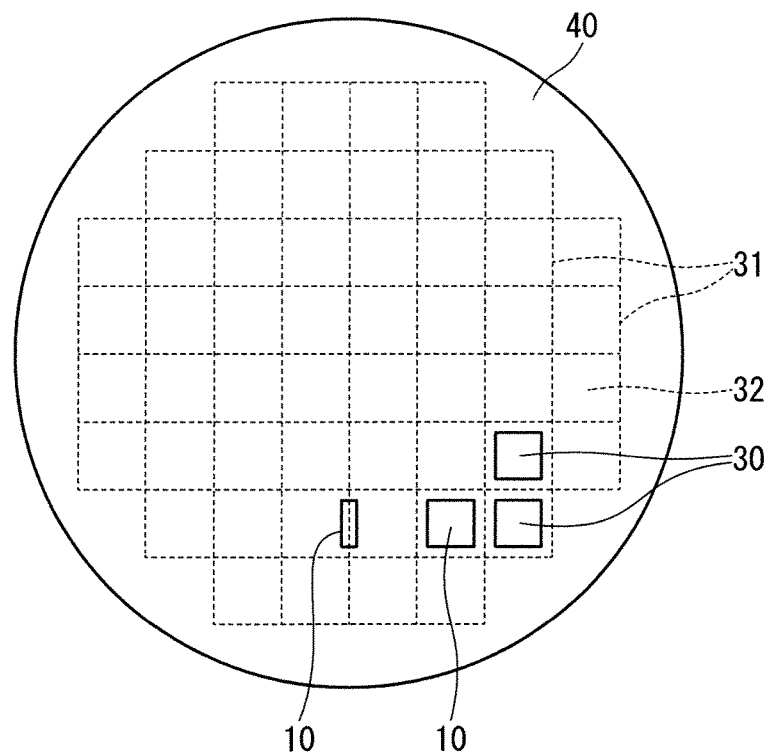
FIG. 1 is a plan view of a SiC wafer on which a semiconductor device according to a first preferred embodiment s disposed.

FIG. 1 is a plan view of a SiC wafer on which a semiconductor device according to a first preferred embodiment is disposed. The semiconductor device is disposed on a SiC wafer 40. The SiC wafer 40 includes a plurality of chip-formation regions 32 sectioned by dicing lines 31. SiC transistors 30 are disposed on the chip-formation regions 32. At least one evaluation element 10 is disposed on the SIC wafer 40. This evaluation element 10 may be disposed, in the chip-formation region 32, on the dicing line 31 or in a region between the chip-formation region 32 and the rim of the SiC wafer 40. Although FIG. 1 illustrates two evaluation elements 10, at least one evaluation element 10 requires to be provided.

In the first preferred embodiment, an example of the SiC transistor 30 is a MOS-FET. The description of a configuration of the SIC transistor 30 is omitted.

Figure 2:
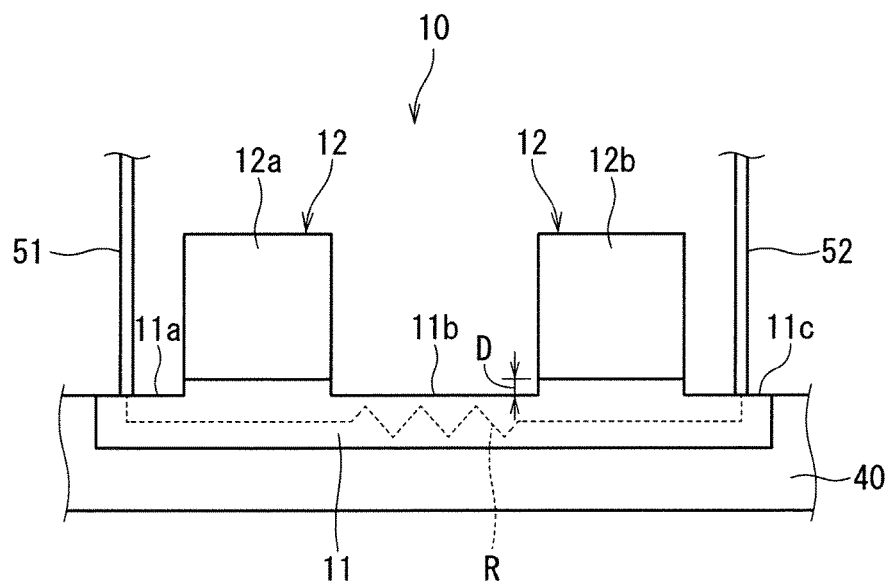
FIG. 2 is a cross-sectional view of an evaluation element according to the first preferred embodiment.
Figure 3:
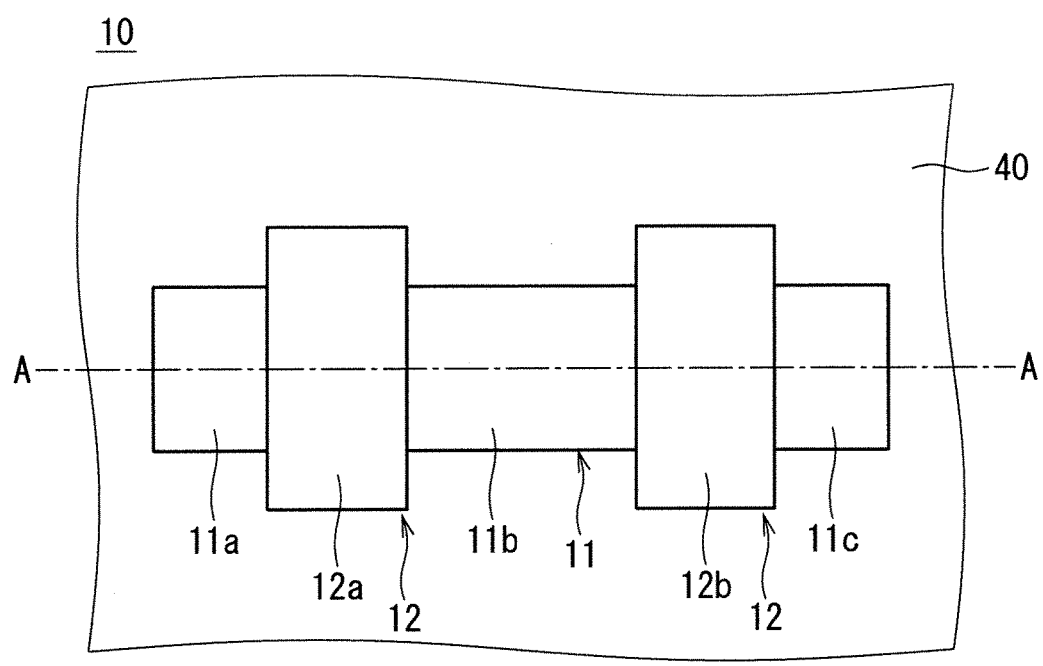
FIG. 3 is a plan view of the evaluation element according to the first preferred embodiment.

FIG. 2 is a cross-sectional view of the evaluation element 10 according to the first preferred embodiment. FIG. 3 is a plan view of the evaluation element 10. FIG. 2 is the cross-sectional view taken alone line A-A in FIG. 3. The evaluation element 10, illustrated in these drawings, is assumedly disposed on the dicing line 31.

As illustrated in FIGS. 2 and 3, the evaluation element 10 includes a doped region 11 and an insulating film 12. The doped region 11 is doped with a dopant on the SiC wafer 40. Here, examples of the dopant include nitrogen (N) and phosphorus (P), which are negative, and aluminum (Al) and boron (B), which are positive.

As illustrated in FIGS. 2 and 3, the insulating film 12 includes a plurality of partial insulating films 12a and 12b on at least the doped region 11. Accordingly, the doped region 11 includes a plurality of regions (i.e., non-covered regions 11a, 11b, and 11c) sectioned by the plurality of partial insulating films 12a and 12b in a plan view. Here, the non-covered regions 11a, 11b, and 11c are regions that are not covered by the insulating film 12.

<Producing Method>

Figure 4:
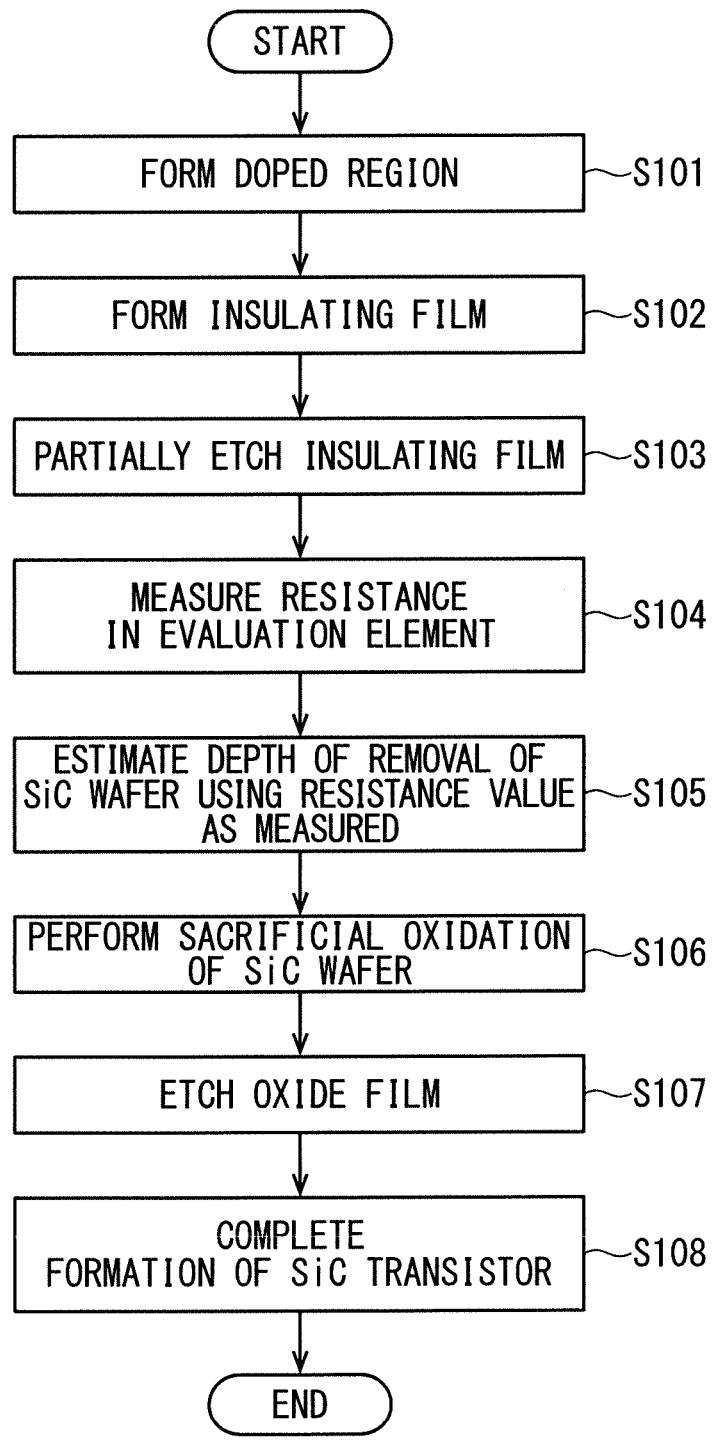
FIG. 4 is a flow chart of a method for producing the semiconductor device according to the first preferred embodiment.

FIG. 4 is a flow chart of a method for producing the semiconductor device. In the first preferred embodiment, the evaluation element 10 is simultaneously formed on the same SiC wafer 40 in the step of forming the SiC transistor 30 on the SiC wafer 40.

The first step (step S101) is doping the SiC wafer 40 with the dopant to form the doped region 11. The doped region 11 is formed by for instance, ion implantation. The specific process for this formation starts with forming a desired mask on the SiC wafer by a photolithography process, followed by doping a surface of the SiC wafer with an impurity by ion implantation through the mask. The next step is repeating the doping step in accordance with different conditions that are usually multiple conditions including an impurity, followed by high-temperature annealing to activate the impurity. This completes the formation of the doped region. Here, various conditions including a kind, conductivity type, and concentration of a to-be-doped dopant are determined by a configuration of the SiC transistor 30 to be produced.

The next step (step S102) is forming the insulating film 12 over the entire SiC wafer 40 including the doped region 11. An example of the insulating film 12 is a TEOS film formed on the surface of the SiC wafer 40 by CVD.

The following step (step S103) is partially etching the insulating film 12 on the doped region 11, constituting the evaluation element 10, to form the plurality of partial insulating films 12a and 12b. At this point, the insulating film 12 is partially etched in the SiC transistor 30 as well, to form a desired pattern.

The step S103 includes: applying a photoresist to the insulating 12 while for instance, rotating the SiC wafer 40; exposing the photoresist to light through a photomask on which a predetermined pattern is made, so as to be photosensitive; dissolving a sensitized portion of the photoresist (for a positive photoresist); and dry-etching the insulating film 12 through a resist pattern. When the insulating film 12 undergoes the dry-etching, a surface of the doped region 11 under the insulating film 12 is also removed by a depth D indicated in FIG. 2 as a result of the dry-etching.

The evaluation element 10 is formed through the aforementioned steps S101 to S103. As illustrated in FIGS. 2 and 3, the doped region 11 of the evaluation element 10 includes the plurality of non-covered regions 11a, 11b, and 11c sectioned by the plurality of partial insulating films 12a and 12b in a plan view.

The next step (step S104) is measuring a resistance R of the doped region 11 with two regions 11a and 11c of the plurality of non-covered regions, which sandwich one region 11b of the plurality of non-covered regions in the evaluation element 10, respectively brought into contact with resistance-measurement needles 51 and 52 as illustrated in FIG. 2.

At this time, for the SiC wafer 40, a resistance-measurement needle is brought into contact with a doped region (substrate) without an electrode that includes an aluminum wire not being formed. This enables a resistance of the doped region to be measured. As such, the first preferred embodiment enables the measurement of the resistance R just after the etching step (i.e., step 103).

Although FIG. 2 illustrates the measurement of the resistance R using the two resistance-measurement needles 51 and 52, the resistance R may be measured by a four-terminal measuring method using four resistance-measurement needles, for instance.

Figure 5:
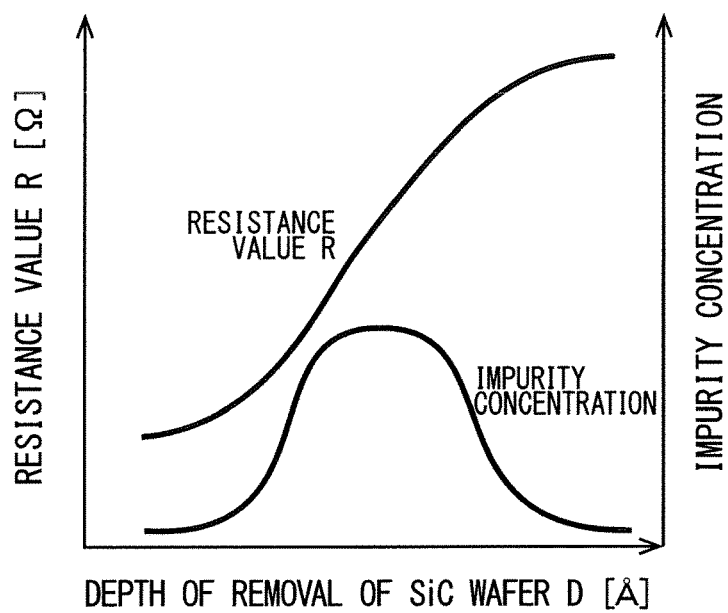
FIG. 5 is a graph showing a relationship between a depth of removal of the SiC wafer and a resistance, in the evaluation element according to the first preferred embodiment.

The next step (step S105) is estimating the depth D of removal of the SiC wafer 40 as a result of the etching using the resistance R measured in the step S104. FIG. 5 is a graph showing a relationship between the depth of removal of the SiC wafer 40 and the resistance R, in the evaluation element 10. FIG. 5 illustrates a relationship between the depth of the SiC wafer 40 and an impurity concentration. As illustrated in FIG. 5, the resistance R is dependent on the depth D of removal of the SiC wafer 40 because a change in the depth D of removal of the SiC wafer 40 changes the thickness of the doped region 11, which has a low resistance.

As illustrated in FIG. 5, a characteristic curve that indicates the relationship between the depth D of removal of the SiC wafer 40 and the resistance R (hereinafter referred to as a D-R curve) is obtained by an experiment or simulation in advance. Referring to the D-R curve enables the depth D of removal of the SiC wafer to be estimated from the resistance R as measured.

The next step (step S106) is performing sacrificial oxidization of the SiC wafer 40. At this time, a heating time of the sacrificial oxidation is adjusted in accordance with the depth D estimated in the step S105. In other words, when the depth D estimated in the step S105 is small, the heating time is set to be longer, so that an oxide film formed by the sacrificial oxidation has a larger thickness. On the other hand, when the depth D estimated in the step S105 is large, the heating time is set to be shorter, so that the oxide film formed by the sacrificial oxidation has a smaller thickness.

The next step (step S107) is etching the oxide film as a result of the sacrificial oxidation for removal. The etching is performed by wet-etching. At this time, a time for the wet etching is adjusted in accordance with the heating time in the step S106, i.e., in accordance with the thickness of the sacrificially-oxidized film. Defects on the surface of the SiC wafer are removed through the sacrificial oxidation step (step S106) and the oxide-film etching step (step S107).

Then, steps for forming the SiC transistor 30 are continuously performed, to thus complete the formation of the SiC transistor 30 on the SiC wafer 40 (step S108). An example of major, subsequent steps for forming the SiC transistor is forming a gate oxide film by thermal oxidation after the previous etching of the oxide film (step S107), followed by forming a gate electrode made of polysilicon on the gate oxide film. After the formation of the gate electrode, the next step is providing the TEOS film formed by CVD as an interlayer insulating film, followed by forming a contact hole in an electrode portion of the TEOS film, followed by forming a wire made of a metal such as aluminum by sputtering. Then, the next step is forming a protective film on a front surface of the TEOS film and an electrode on a back surface of the TEOS film. These steps complete the formation of the SiC transistor 30 on the SiC wafer 40. Then, the SiC wafer 40 is cut, along the dicing lines 31, into the individual SiC transistors 30 now separated from the wafer.

A depth of removal of the SiC wafer 40, after the completion of the step S107 amounts to the sum of the depth D of removal as a result of the etching in the step 103 and the depth of removal as a result of the etching in the step S107. Accordingly, in the first preferred embodiment, the depth D is estimated using the resistance R of the evaluation element 10 after the etching in the step S103. Further, a condition of the sacrificial oxidation or condition of the etching of the oxide film in a subsequent step is adjusted in accordance with the depth D as estimated. Such adjustment enables the depth of removal of the SiC wafer 40 after the completion of the step S107 to accurately approach a desired depth.

A condition of the etching step (step S103) may be adjusted in accordance with the depth D estimated in the step S105, in the step of producing a semiconductor device in a subsequent lot. In other words, when the depth D estimated in the step S105 in a preceding lot is larger than a predetermined depth, a processing time in the etching step (step S103) in the subsequent lot is set to be shorter. On the other hand, when the depth D estimated in the step S105 in the preceding lot is smaller than the predetermined depth, the processing time in the etching step (step S103) in the subsequent lot is set to be longer. Such adjustment reduces or eliminates a difference between the depth D of removal of the SiC wafer 40 in the subsequent lot and the depth of D of removal of the SiC wafer 40 in the preceding lot.

<Effect>

The semiconductor device according to the first preferred embodiment includes the at least one evaluation element 10 disposed on the SiC wafer 40. The at least one evaluation element 10 includes the doped region 11 doped with the dopant on the SiC wafer 40, and the insulating film 12 partially covering the doped region 11. The insulating film 12 includes the plurality of partial insulating films 12a and 12b. The doped region 11 includes the plurality of regions (i.e., non-covered regions 11a, 11b, and 11c) sectioned by the plurality of partial insulating films 12a and 12b in a plan view.

Accordingly, forming the evaluation element 10 on the SiC wafer 40 enables the resistance R of the evaluation element 10 to be measured, and enables the depth D of removal of the SiC wafer 40 to be estimated using the resistance R.

In the semiconductor device according to the first preferred embodiment, the insulating film 12 is formed by partially etching a continuous insulating film. Thus, the insulating film 12 has an almost uniform thickness, anywhere on the SiC wafer 40.

The method for producing the semiconductor device according to the first preferred embodiment includes forming the at least one SiC transistor 30 on the SiC wafer 40. The forming of the at least one SiC transistor includes (a) forming the at least one evaluation element 10 on the SiC wafer 40. The step (a) includes: (a1) doping the SiC wafer 40 with the dopant to form the doped region 11; (a2) forming the insulating film 12 over the doped region 11; and (a3) partially etching the insulating film 12 to form the plurality of partial insulating films 12a and 12b. In the evaluation element 10, the doped region 11 includes the plurality of non-covered regions 11a, 11b, and 11c sectioned by the plurality of partial insulating films 12a and 12b in a plan view. The step (a) further includes: (a4) after the step (a3), measuring the resistance R of the doped region 11 with the plurality of non-covered regions 11a and 11c, which sandwich the one region 11b of the plurality of non-covered regions, respectively brought into contact with the resistance-measurement needles 51 and 52; (a5) estimating the depth of removal of the SiC wafer 40 as a result of the etching, using the resistance measured in the step (a4); (a6) after the step (a5), performing sacrificial oxidation of the SiC wafer 40; and (a7) etching the oxide film formed as a result of the sacrificial oxidation in the step (a6) for removal.

In the first preferred embodiment, the depth D of removal of the SiC wafer 40 is estimated using the resistance of the evaluation element 10. Such a configuration enables the depth D to be obtained without being affected by the thickness of the insulating film 12. This enables the depth D of removal of the SiC wafer 40 to be obtained with high accuracy without being affected by a variation in thickness of the insulating film 12, as compared with measurement by a step measuring instrument, in which a measured value is affected by the variation in thickness of the insulating film 12.

In the first preferred embodiment, the evaluation element 10 is formed without a further forming step in addition to the step of forming the SiC transistor 30.

In the first preferred embodiment, the resistance R of the evaluation element 10 is measured soon after the completion of the etching step (i.e., step (a3)). This enables a processing condition in the subsequent steps to be adjusted in accordance with the depth D of removal of the SIC wafer 40 estimated from the resistance D.

Specifically, the method for producing the semiconductor device according to the first preferred embodiment includes adjusting a condition of the sacrificial oxidation in the step (a6) or a condition of the etching of the oxide film in the step (a7), in accordance with the depth D estimated in the step (a5).

This adjustment enables a final depth of removal of the SiC wafer 40 to approach a desired value with high accuracy. This enables an electrical property of the SiC transistor 30 to approach a design value with high accuracy.

The method for producing the semiconductor device according to the first preferred embodiment also includes adjusting a condition of the etching of the insulating film 12 in the step (a3) in forming the SiC transistor 30 in the subsequent lot, in accordance with the depth D measured in the step (a5).

Such adjustment reduces or eliminates the difference between the lots in terms of the depth D of removal of the SiC wafer 40. This reduces or eliminates a difference between the lots in terms of the electrical property of the SiC transistor 30.

Second Preferred Embodiment

<Configuration>

Figure 6:
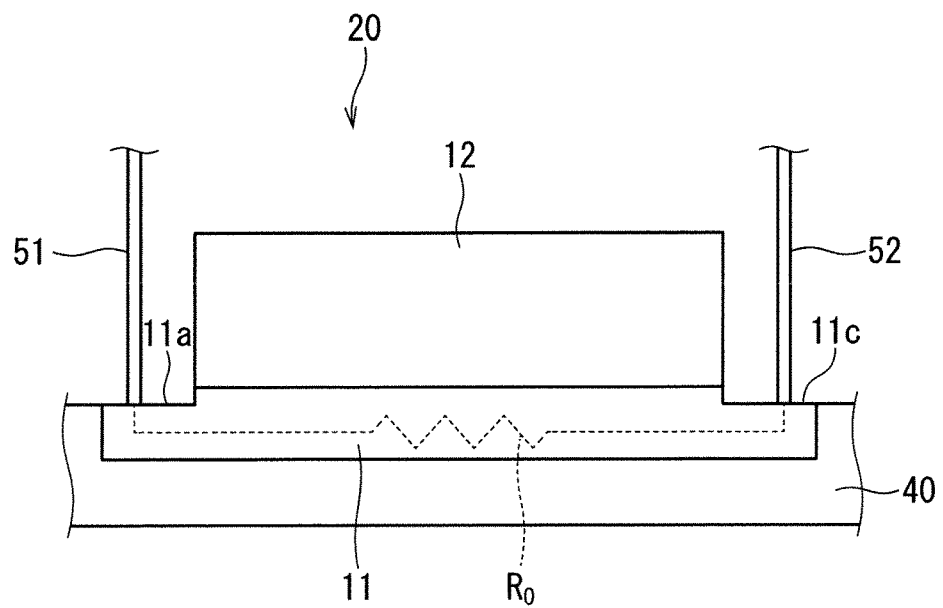
FIG. 6 is a cross-sectional view of a reference-resistance evaluation element according to a second preferred embodiment.
Figure 7:
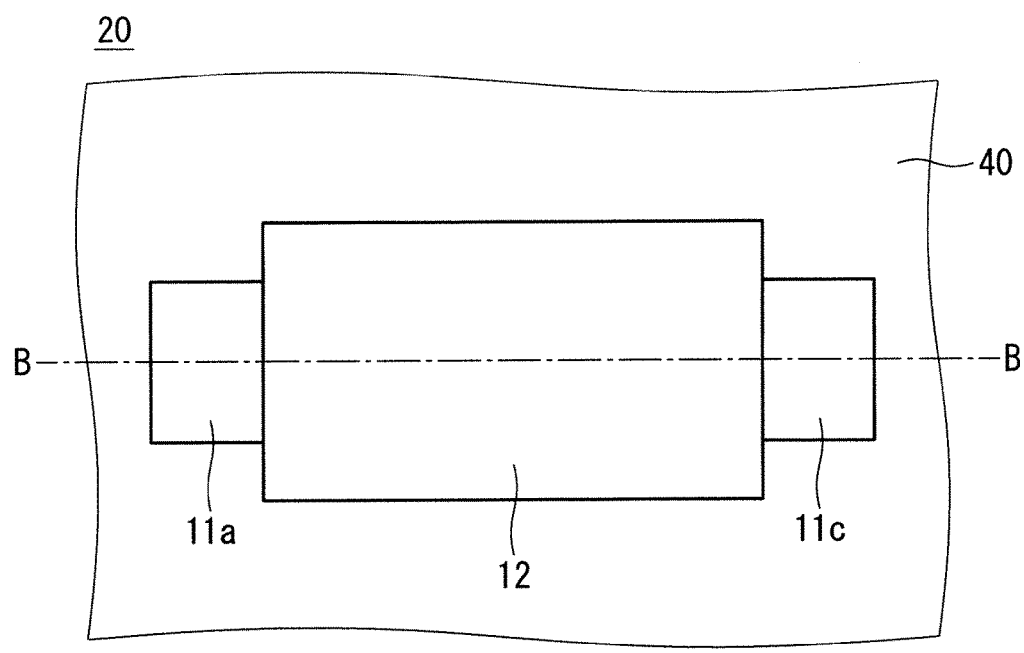
FIG. 7 is a plan view of the reference-resistance evaluation element according to the second preferred embodiment.

FIG. 6 is a cross-sectional view of the reference-resistance evaluation element 20 according to a second preferred embodiment. FIG. 7 is a plan view of the reference-resistance evaluation element 20. FIG. 6 is the cross-sectional view taken along line B-B in FIG. 7.

The semiconductor device according to the second preferred embodiment further includes at least one reference-resistance evaluation element 20. The reference-resistance evaluation element 20 is disposed on a SiC wafer identical to the SiC wafer 40 on which the evaluation element 10 is disposed, where the reference-resistance evaluation element 20 is disposed in the chip-formation regions 32, on the dicing lines 31, and in a region between the chip-formation regions 32 and the rim of the SiC wafer 40.

The reference-resistance evaluation element 20 includes the doped region 11 and the insulating film 12 partially covering the doped region 11. The doped region 11 includes two regions (i.e., non-covered regions 11a and 11c) sectioned by the insulating film 12 in a plan view. Here, the non-covered regions 11a and 11c are regions that are not covered by the insulating film 12. In other words, the doped region 11 between the non-covered regions 11a and 11c is covered by the insulating film 12 in a plan view.

<Producing Method>

The method for producing the semiconductor device according to the second preferred embodiment includes forming the reference-resistance evaluation element 20 on the SiC wafer 40 simultaneously with the evaluation element 10, in the steps S101 to S103 in FIG. 4. Next, the step S104 in FIG. 4 includes measuring a reference-resistance $R_0$ of the reference-resistance evaluation element 20 in addition to measuring the resistance R of the evaluation element 10. Specifically, as illustrated in FIG. 6, the method includes measuring a resistance $R_0$ of the doped region 11 (hereinafter referred to as a reference-resistance $R_0$) with the two non-covered regions 11a and 11c respectively brought into contact with the resistance-measurement needles 51 and 52 in the reference-resistance evaluation element 20.

Although FIG. 6 illustrates the measurement of the reference-resistance $R_0$ using the two resistance-measurement needles 51 and 52, the measurement of the reference-resistance $R_0$ may be performed by a four-terminal measurement method using, for instance, four resistance-measurement needles.

Next, the step S105 includes estimating the depth D of removal of the SiC wafer 40 as a result of the etching using the resistance R of the evaluation element 10 and the reference-resistance $R_0$ of the reference-resistance evaluation element 20.

In the second preferred embodiment, the reference-resistance $R_0$ is regarded as a resistance value at the depth D of removal of the SiC wafer 40 being zero, and the D-R curve in FIG. 5 is relativized by the reference-resistance $R_0$. In other words, the resistance R on a vertical axis of the D-R curve in FIG. 5 is replaced with $R/R_0$. Then, the depth D at a value in which an actually-measured resistance R is relativized by the reference resistance $R_0$ (i.e., $R/R_0$) is read. Accordingly, the depth D is estimated to be a depth of removal of the SiC water 40.

There is a difference between an experiment condition (measurement condition) for an actual electrical property of the SiC wafer 40 and an experiment condition (measurement condition) for the D-R curve, due to a variation, such as a variation in resistance value, caused by the quality of the SiC wafer 40 itself, or a variation in temperature in an annealing process for activating an impurity as doped. However, in the second preferred embodiment, each of the actually-measured resistance R and the D-R curve is relativized by the reference-resistance $R_0$. This reduces or eliminates influence of the difference between both measurement conditions.

The subsequent steps (steps S106 to S108 in FIG. 4) are the same as those in the first preferred embodiment. Thus, the description of these steps is omitted.

<Effect>

The semiconductor device according to the second preferred embodiment further includes the at least one reference-resistance evaluation element 20 disposed on the SiC wafer identical to the SiC wafer 40 on which the evaluation element 10 is disposed. The reference-resistance evaluation element 20 includes the doped region 11 doped with the dopant on the SiC wafer 40, and the insulating film 12 partially covering the doped region 11. The doped region 11 includes the two non-covered regions 11a and 11c sectioned by the insulating film 12 in a plan view.

Accordingly, further placing the reference-resistance evaluation element 20 on the SiC wafer 40 in addition to the evaluation element 10 enables a resistance in a yet-to-be removed SiC wafer 40 to be measured.

The method for producing the semiconductor device according to the second preferred embodiment includes forming the at least one SiC transistor 30 on the SiC wafer 40. The forming of the at least one SiC transistor 30 includes (b) further forming the at least one reference-resistance evaluation element 20 on the SiC wafer 40 separately from the formation of the evaluation element 10. In the reference-resistance evaluation element 20, the doped region 11 includes the two non-covered regions 11a and 11c in a plan view. The doped region 11 between the two non-covered regions 11a and 11c is covered by the insulating film 12 in a plan view. The step (b) further includes (b1) after the step (a3), measuring the reference-resistance $R_0$ of the doped region 11 with the two non-covered regions 11a and 11c of reference-resistance evaluation element 20 respectively brought into contact with the resistance-measurement needles 51 and 52. The step (a5) includes measuring the depth D of removal of the SiC wafer 40 as a result of the etching in the evaluation element 10, using the reference-resistance $R_0$ as the resistance value at the depth of removal of the SiC wafer 40 being zero.

Figure 8:
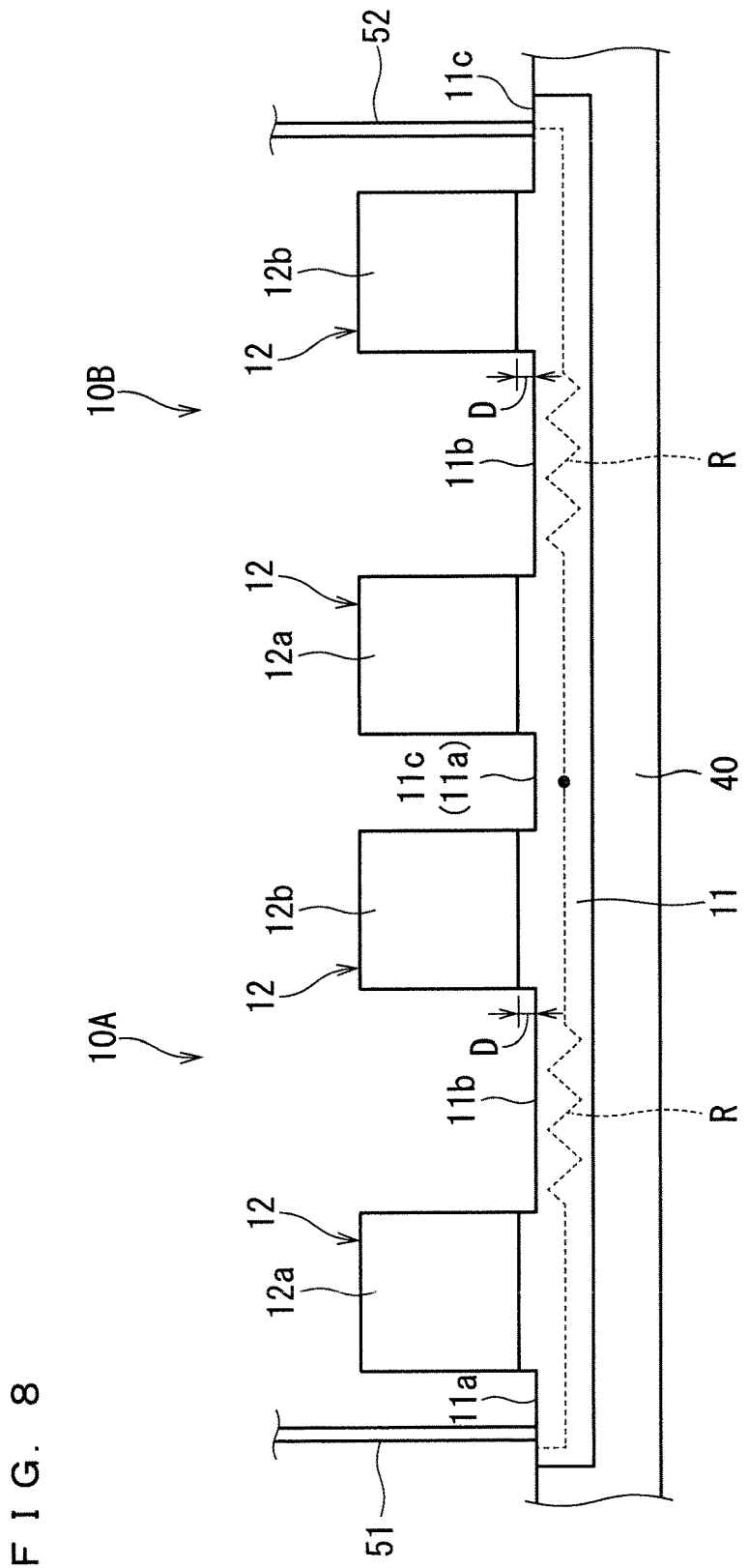
FIG. 8 is a cross-sectional view of an evaluation element according to a third preferred embodiment.

The measurement of the reference-resistance $R_0$ in the reference-resistance evaluation element 20 and the use of a measured value as the resistance value at the depth of removal of the SiC wafer 40 being zero enable the resistance R to be relativized by the reference-resistance $R_0$. This relativization reduces or eliminates the influence of the variation, such as the variation in resistance value, caused by the quality of the SiC wafer 40 itself, or the variation in temperature in the annealing process for activating the impurity as doped, upon an estimated value of the depth D of removal of the SiC wafer 40. This enables the depth D of removal of the SiC wafer 40 to be estimated with higher accuracy, Third Preferred Embodiment FIG. 8 is a cross-sectional view of the evaluation element according to a third preferred embodiment. As illustrated in FIG. 8, the SiC wafer 40 includes two evaluation elements 10A and 10B in the third preferred embodiment. This two evaluation elements 10A and 10B are arranged side by side so that the doped region 11 is continuous; that is, the two evaluation elements 10A and 10B are arranged so that resistances R are connected in series.

In the third preferred embodiment, the step S104 in FIG. 4 includes measuring the series resistance. In other words, the step S104 includes measuring the series resistance with, as illustrated in FIG. 8, the non-covered region 11a of the evaluation element 10A and the non-covered regions 11c of the evaluation element 10B respectively brought into contact with the resistance-measurement needles 51 and 52. Then, a measured resistance is divided by two to calculate the resistance R per evaluation element 10.

Although the two evaluation elements 10A and 10B are connected in series in die third preferred embodiment, more than two evaluation elements may be connected in series. More evaluation elements connected in series enable the resistance R per evaluation element to be measured with higher accuracy.

The subsequent process steps (steps S105 to S108 in FIG. 4) are the same as those in the first preferred embodiment. Thus, the description of these steps is omitted.

Although in the third preferred embodiment, the plurality of evaluation elements 10A and 10B are connected in series, a plurality of reference-resistance evaluation elements 20 may be connected in series. Then, the reference-resistance $R_0$ per reference-resistance evaluation element is measured in the same manner as the resistance R per evaluation element. This enables the reference-resistance $R_0$ to be measured with higher accuracy.

<Effect>

In the semiconductor device according to the third preferred embodiment, the at least one evaluation element 10 includes a plurality of evaluation elements, and the plurality of evaluation elements 10A and 10B are arranged side by side so that the doped region 11 is continuous.

Accordingly, arranging the plurality of evaluation elements 10A and 10B side by side so that the doped region 11 is continuous enables the series resistance of the plurality of evaluation elements 10A and 10B to be measured.

In the method for producing the semiconductor device according to the third preferred embodiment, the at least one evaluation element 10 includes a plurality of evaluation elements. Further, the plurality of evaluation elements 10A and 10B are arranged side by side so that the doped region 11 is continuous. Still further, the step (a4) includes measuring the series resistance of the plurality of evaluation elements 10A and 10B.

In the third preferred embodiment, the plurality of evaluation elements 10A and 10B are provided to establish the series resistance, and the series resistance are measured. Such a configuration enables the resistance per evaluation element to be measured with higher accuracy. Consequently, the depth D of removal of the SiC wafer 40 is measured with high accuracy.

Fourth Preferred Embodiment

Figure 9:
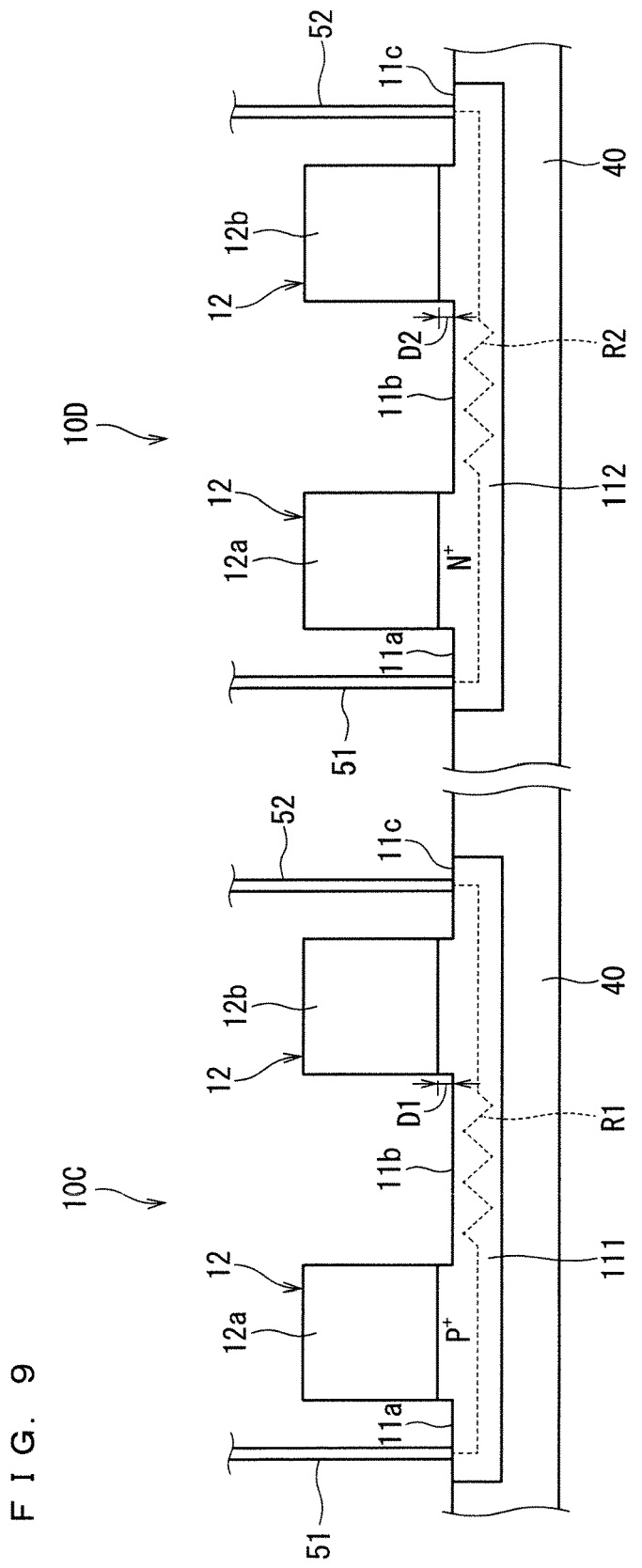
FIG. 9 is a cross-sectional view of an evaluation element according to a fourth preferred embodiment.

FIG. 9 is a cross-sectional view of the evaluation element according to a fourth preferred embodiment. As illustrated in FIG. 9, the SiC wafer 40 includes two evaluation elements 10C and 10D in the fourth preferred embodiment. A doped region 111 in the evaluation element 10C is a $P^+$ region doped with an impurity of a positive conductivity type (e.g., aluminum) SiC wafer 40. Meanwhile, a doped region 112 in the evaluation element 10D is an $N^+$ region doped with an impurity of a negative conductivity type (e.g., nitrogen) on the SiC wafer 40. The doped region 111 and the doped region 112 have different impurity concentrations.

In the method for producing the semiconductor device according to the fourth preferred embodiment, the evaluation element 10C and the evaluation element 10D are formed through the steps S101 to S103 in FIG. 4. Next, the step S104 in FIG. 4 includes measuring a resistance R1 of the evaluation element 10C and a resistance R2 of the evaluation element 10D. A method of measuring the resistances R1 and R2 is the same as that in the first preferred embodiment.

Next, the step S105 in FIG. 4 includes estimating a depth D1 of removal of the SiC wafer 40 using the resistance R1 as measured. The step S105 also includes estimating a depth D2 of removal of the SiC wafer 40 using the resistance R2 as measured. Then, the step S105 includes taking the average of the depth D1 and the depth D2, to thus determine the depth D of removal of the SiC wafer 40.

The subsequent process steps (steps S106 to S108 in FIG. 4) are the same as those in the first preferred embodiment. Thus, the description of these steps is omitted.

In the fourth preferred embodiment, the two evaluation elements 10C and 10D are formed that are different from each other in a condition of the doped region (i.e., at least one of a conductivity type of the doped region, a kind of the dopant, and a doping concentration of the dopant). An n number of evaluation elements may be formed that are different from each other in the condition of the doped region. Here, the "n" is an integer equal to or greater than two. In this case, depths D1, D2, . . . and Dn are separately estimated from each evaluation element, and then the average of remaining depths excluding, for instance, a maximum depth and a minimum depth is taken, to determine the depth D of removal of the SiC wafer 40.

Example of regions whose conditions of the doped region are different include a guard ring (GR) region, N-well region, P-well region, source region, and $P^+$ diffusion region in the SiC transistor 30.

Any different conditions of the doped region may cause a variation in estimated value of the depth D of removal of the SiC wafer 40. The fourth preferred embodiment reduces or eliminates influence of such different conditions of the doped region upon the estimation of the depth D of removal of the SiC wafer 40.

In the fourth preferred embodiment, the reference-resistance evaluation element 20 may be formed that includes the doped region 111 whose condition is the same as that of the evaluation element 10C. Further, the reference-resistance evaluation element 20 may be formed that includes the doped region 112 whose condition is the same as that of the evaluation element 10D. Here, the same condition of the doped region means the same electrical property of the doped region. Consequently, each of the resistances R and R2 in the respective evaluation elements 10A and 10B is relativized by the reference-resistance $R_0$, as described in the second preferred embodiment. This enables the depths D1 and D2 to be estimated with higher accuracy.

<Effect>

In the semiconductor device according to the fourth preferred embodiment, the at least one evaluation element 10 includes a plurality of evaluation elements. Further, the plurality of evaluation elements 10C and 10D are different from each other in at least one of the conductivity type of the doped region 11 (i.e., doped regions 111 and 112), the kind of the dopant, and the doping concentration of the dopant.

Accordingly, forming the plurality of evaluation elements 10C and 10D, whose conditions of the doped region 11 are different from each other, enables the depth D of removal of the SiC wafer 40 to be estimated from the plurality of evaluation elements 10C and 10D, whose conditions of the doped region 11 are different from each other.

In the semiconductor device according to the fourth preferred embodiment, the at least one evaluation element 10 includes a plurality of evaluation elements. Further, the plurality of evaluation elements 10C and 10D are different from each other in at least one of the conductivity type of doped region 11 (i.e., doped regions 111 and 112), the kind of the dopant, and the doping concentration of the dopant. The at least one reference-resistance evaluation element 20 includes a plurality of reference-resistance evaluation elements. The doped region 11 of each of the plurality of reference-resistance evaluation elements 20 has an electrical property identical to an electrical property of the doped region 11 of each of the plurality of evaluation elements 10C and 10D.

Accordingly, the evaluation element 10 and the reference-resistance evaluation element 20 are formed in a pair, in the doped regions 11 of the same electrical property. This enables the resistance R, which is measured in the evaluation element 10 to be relativized by the reference-resistance $R_0$, which is measured in the reference-resistance evaluation element 20.

In the method for producing the semiconductor device according to the fourth preferred embodiment, the at least one evaluation element 10 includes a plurality of evaluation elements. Further, the evaluation elements 10C and 10D are different from each other in at least one of the conductivity type of the doped region 11 (i.e., doped regions 111 and 112), the kind of the dopant, and the doping concentration of the dopant. Still further, the step (a4) includes measuring the resistances R1 and R2 in the respective evaluation elements 10C and 10D.

In the fourth preferred embodiment, the resistances R1 and R2 are measured in the respective plurality of evaluation elements 10C and 10D, whose conditions of the doped region are different from each other, and the depths D1 and D2 of removal of the SiC wafer 40 is estimated using the respective resistances as measured. Then, the average of the depths D1 and D2 are taken, for instance, to thus reduce or eliminate influence of the difference between the conditions of the doped region upon the depth D of the SiC wafer 40. This enables the depth D of removal of the SiC wafer 40 to be estimated with higher accuracy.

In the method for producing semiconductor device according to the fourth preferred embodiment, the at least one evaluation element 10 includes a plurality of evaluation elements. The plurality of evaluation elements 10C and 10D are different from each other in at least one of the conductivity type of the doped region 11 (i.e., doped regions 111 and 112), the kind of the dopant, and the doping concentration of the dopant. Further, the step (a4) includes measuring the resistances R1 and R2 in the respective plurality of evaluation elements 10C and 10D. Still further, the at least one reference-resistance evaluation element 20 includes a plurality of reference-resistance evaluation elements. Yet further, the doped region of each of the plurality of reference-resistance evaluation elements 20 has the electrical property identical to the electrical property of the doped region 11 of each of the evaluation elements 10C and 10D. Still yet further, the step (b1) includes measuring the reference-resistance $R_0$ in each of the plurality of reference-resistance evaluation elements 20.

Consequently, each of the resistances R1 and R2 of the respective plurality of evaluation elements 10C and 10D, whose conditions of the doped region are different from each other, is relativized by the reference-resistance. Such relativization enables the depth D of removal of the SiC wafer 40 to be obtained with higher accuracy.

It is to be noted that in the present invention, respective preferred embodiments can be freely combined, or can be modified and omitted as appropriate, within the scope of the invention. For instance, to miniaturize the evaluation element, the insulating film (plurality of partial insulating s) on the doped region in the evaluation element may be omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   at least one evaluation element disposed on a silicon carbide (SiC) wafer,
   wherein said at least one evaluation element comprises
   a doped region doped with a dopant on said SiC wafer, and
   an insulating film partially covering said doped region,
   wherein said insulating film comprises a plurality of partial insulating films, and
   wherein said doped region comprises a plurality of regions sectioned by said plurality of partial insulating films in a plan view; and
   at least one reference-resistance evaluation element disposed on a SiC wafer identical to said SiC wafer on which said at least one evaluation element is disposed,
   wherein said at least one reference-resistance evaluation element comprises
   a doped region doped with said dopant on said SiC wafer, and
   an insulating film partially covering said doped region, and
   wherein said doped region comprises two regions sectioned by said insulating film in a plan view.

2. The semiconductor device according to claim 1, wherein said insulating film is formed by partially etching a continuous insulating film.

3. The semiconductor device according to claim 1,
   wherein said at least one evaluation element comprises a plurality of evaluation elements, and
   wherein said plurality of evaluation elements are arranged side by side so that said doped region is continuous.

4. The semiconductor device according to claim 1,
   wherein said at least one evaluation element comprises a plurality of evaluation elements, and
   wherein said plurality of evaluation elements are different from each other in at least one of a conductivity type of said doped region, a kind of said dopant, and a doping concentration of said dopant.

5. The semiconductor device according to claim 1,
   wherein said at least one evaluation element comprises a plurality of evaluation elements,
   wherein said plurality of evaluation elements are different from each other in at least one of a conductivity type of said doped region, a kind of said dopant, and a doping concentration of said dopant,
   wherein said at least one reference-resistance evaluation element comprises a plurality of reference-resistance evaluation elements, and
   wherein an electrical property of said doped region of each of said plurality of reference-resistance evaluation elements is identical to an electrical property of said doped region of each of said plurality of evaluation elements.

6. A method for producing a semiconductor device, comprising:
   forming at least one SiC transistor on a SiC wafer,
   wherein said forming of said at least one SiC transistor comprises (a) forming at least one evaluation element on said SiC wafer,
   wherein said step (a) comprises
   (a1) doping said SiC wafer with a dopant to form a doped region,
   (a2) forming an insulating film over said doped region, and
   (a3) partially etching said insulating film to form a plurality of partial insulating films, wherein in said at least one evaluation element, said doped region comprises a plurality of non-covered regions sectioned by said plurality of partial insulating films in a plan view, and wherein said step (a) further comprises (a4) after said step (a3), measuring a resistance of said doped region with said plurality of non-covered regions that sandwich one of said plurality of non-covered regions brought into contact with respective resistance-measurement needles, in said at least one evaluation element, (a5) estimating a depth of removal of said SiC wafer as a result of said etching, using said resistance measured in said step (a4), (a6) after said step (a5), performing sacrificial oxidation of said SiC wafer, and (a7) etching an oxide film formed as a result of said sacrificial oxidation in said step (a6) for removal.

7. The method for producing a semiconductor device according to claim 6, comprising adjusting a condition of said sacrificial oxidation in said step (a6) or a condition of said etching of said oxide film in said step (a7), in accordance with said depth estimated in said step (a5).

8. The method for producing a semiconductor device according to claim 6, comprising adjusting a condition of said etching of said insulating film in said step (a3) in forming said at least one SiC transistor in a subsequent lot, in accordance with said depth estimated in said step (a5).

9. The method for producing a semiconductor device according to claim 6, comprising forming said at least one SiC transistor on said SiC wafer, wherein said forming of said at least one SiC transistor further comprises (b) forming at least one reference-resistance evaluation element on said SiC wafer, wherein in said at least one reference-resistance evaluation element, said doped region comprises two non-covered regions in a plan view, said doped region between said two non-covered regions being covered by said insulating film in a plan view, wherein said step (b) further comprises (b1) after said step (a3), measuring a reference resistance of said doped region with each of said two non-covered regions of said at least one reference-resistance evaluation element brought into contact with said resistance-measurement needle, and wherein said step (a5) comprises estimating said depth of removal of said SiC wafer as a result of said etching in said at least one evaluation element, using said reference resistance as a resistance value at said depth of removal of said SiC wafer being zero.

10. The method for producing a semiconductor device according to claim 6, wherein said at least one evaluation element comprises a plurality of evaluation elements, wherein said plurality of evaluation elements are arranged side by side so that said doped region is continuous, and wherein said step (a4) comprises measuring a series resistance of said plurality of evaluation elements.

11. The method for producing a semiconductor device according to claim 6, wherein said at least one evaluation element comprises a plurality of evaluation elements, wherein said plurality of evaluation elements are different from each other in at least one of a conductivity type of said doped region, a kind of said dopant, and a doping concentration of said dopant, and wherein said step (a4) comprises measuring said resistance in each of said plurality of evaluation elements.

12. The method for producing a semiconductor device according to claim 9, wherein said at least one evaluation element comprises a plurality of evaluation elements, wherein said plurality of evaluation elements are different from each other in at least one of a conductivity type of said doped region, a kind of said dopant, and a doping concentration of said dopant, wherein said step (a4) comprises measuring said resistance in each of said plurality of evaluation elements, wherein said at least one reference-resistance evaluation element comprises a plurality of reference-resistance evaluation elements, wherein said doped region of each of said plurality of reference-resistance evaluation elements comprises an electrical property identical to an electrical property of said doped region of each of said plurality of evaluation elements, and wherein said step (b1) comprises measuring said reference resistance in each of said plurality of reference-resistance evaluation elements.

13. A semiconductor device comprising:

a plurality of evaluation elements, each of said evaluation elements being disposed on a silicon carbide (SiC) wafer, wherein each of said evaluation elements comprises a doped region doped with a dopant on said SiC wafer, and an insulating film partially covering said doped region, wherein said insulating film comprises a plurality of partial insulating films, wherein said doped region comprises a plurality of regions sectioned by said plurality of partial insulating films in a plan view, and wherein said plurality of evaluation elements are different from each other in at least one of a conductivity type of said doped region, a kind of said dopant, and a doping concentration of said dopant.

* * * * *